United States Patent
Hwang et al.

(10) Patent No.: US 7,450,393 B2
(45) Date of Patent: Nov. 11, 2008

(54) DRIVER CHIP AND DISPLAY APPARATUS INCLUDING THE SAME

(75) Inventors: Seong-Yong Hwang, Yongin-si (KR); Weon-Sik Oh, Osan-si (KR); Sung-Lak Choi, Osan-si (KR); Chun-Ho Song, Seoul (KR); Ju-Young Yoon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 263 days.

(21) Appl. No.: 10/881,156

(22) Filed: Jun. 30, 2004

(65) Prior Publication Data

US 2005/0157244 A1    Jul. 21, 2005

(30) Foreign Application Priority Data

Jan. 15, 2004    (KR) .................. 10-2004-002965

(51) Int. Cl.
*H05K 7/00*    (2006.01)
(52) U.S. Cl. .................. 361/760; 361/761
(58) Field of Classification Search ............ 257/738, 257/654; 29/840; 437/183; 361/760, 761; 438/612

See application file for complete search history.

(56) References Cited

U.S. PATENT DOCUMENTS

| | | | | |
|---|---|---|---|---|
| 5,705,855 | A * | 1/1998 | Carson et al. | 257/737 |
| 6,506,672 | B1 * | 1/2003 | Dagenais et al. | 438/612 |
| 6,885,146 | B2 * | 4/2005 | Yamazaki et al. | 313/498 |
| 6,987,284 | B2 * | 1/2006 | Hioki et al. | 257/59 |
| 2002/0096781 | A1 | 7/2002 | Toyosawa | |
| 2003/0034168 | A1 | 2/2003 | Yang et al. | |
| 2003/0151055 | A1 | 8/2003 | Tsuji et al. | |
| 2006/0076561 | A1 * | 4/2006 | Hioki et al. | 257/59 |
| 2006/0098154 | A1 * | 5/2006 | Kim et al. | 349/187 |

* cited by examiner

*Primary Examiner*—Dean A. Reichard
*Assistant Examiner*—Abiy Getachew
(74) *Attorney, Agent, or Firm*—F. Chau & Associates, LLC (57) ABSTRACT

A driver chip includes a base body having a driver circuit formed therein. A plurality of conductive bumps is disposed over a top face of the base body, the plurality of conductive bumps being arranged in a plurality of rows along the longitudinal direction of the base body. A plurality of conductive wirings is formed over the top face of the base body that electrically connects the driver circuit to the plurality of conductive bumps.

24 Claims, 11 Drawing Sheets

DRIVER CHIP AND DISPLAY APPARATUS INCLUDING THE SAME

CROSS-REFERENCE TO RELATED APPLICATIONS

This application claims priority based on Korean Patent Application No. 2004-2965 filed on Jan. 15, 2004, the contents of which are herein incorporated by reference in its entirety.

BACKGROUND

1. Technical Field

The present disclosure relates to a driver chip and a display apparatus including the same. More particularly, the present disclosure relates to a driver chip having bumps with increased area and a display apparatus including the driver chip.

2. Discussion of Related Art

Electronic devices such as mobile communication terminals, digital cameras, notebook computers and computer monitors include an image display device to display an image. A flat panel display device, such as a liquid crystal display device, is usually used as the image display device.

The liquid crystal display device displays an image using liquid crystal. Liquid crystal display devices have been widely used in the image display industry because they are thin and exhibit low weight, low power consumption and low operation voltage.

The liquid crystal display device includes a liquid crystal display panel and a driver chip to operate the liquid crystal display panel.

The driver chip converts image data provided from an external source into a drive signal for operating the liquid crystal display panel. The driver chip also provides the drive signal to the liquid crystal display. The driver chip is connected to the liquid crystal display panel by a chip on glass (COG) process to reduce manufacturing costs. According to the COG sealing process, an anisotropic conductive film (ACF) is interposed between the driver chip and the liquid crystal display panel. The ACF is then compressed at a high temperature so that the driver chip is electrically connected to the liquid crystal display panel.

The driver chip includes conductive bumps. The conductive bumps electrically connect the driver chip to the liquid crystal display panel. The number of conductive bumps may be identical to the number of data lines and gate lines formed on the liquid crystal display panel. As liquid crystal display panels have been made with higher resolutions, the number of data lines and gate lines has increased. Accordingly, the number of the conductive bumps in the driver chip has also increased.

However, since the area where the conductive bumps are to be formed is limited, the interval between the conductive bumps has been reduced as the number of conductive bumps has increased, thereby downsizing each of the conductive bumps. Thus, during the COG process using the ACF, failures may occur leading to short or opened circuits.

SUMMARY OF THE INVENTION

A driver chip according to an exemplary embodiment of the invention includes a base body having a driver circuit formed therein. A plurality of conductive bumps is disposed over a top face of the base body, the plurality of conductive bumps being arranged in a plurality of rows along the longitudinal direction of the base body. A plurality of conductive wirings is formed over the top face of the base body that electrically connects the driver circuit to the plurality of conductive bumps.

A display apparatus according to an exemplary embodiment of the invention includes a driver chip and a display panel. The driver chip includes a base body having a driver circuit formed therein. A plurality of conductive bumps is disposed over a top face of the base body, the plurality of conductive bumps being arranged in a plurality of rows along the longitudinal direction of the base body. A plurality of conductive wirings is formed over the top face of the base body that electrically connects the driver circuit to the plurality of conductive bumps. The display panel includes a first substrate having a pad portion connected to the driver chip and a plurality of signal lines connected to the pad portion.

According to at least one embodiment of the invention, the plurality of conductive bumps is arranged in at least four rows. The plurality of conductive bumps may include a plurality of input bumps arranged in at least one row, and a plurality of first output bumps arranged in at least three rows.

The driver chip according to at least one embodiment of the invention may further include a plurality of conductive terminals disposed in a peripheral region of the base body and electrically connected to the driver circuit. The plurality of conductive terminals includes a plurality of input terminals that receive a signal from an external source, and a plurality of output terminals that output a signal from the driver circuit. The plurality of input terminals extends from a first side of the driver circuit and is arranged along the longitudinal direction of the base body, and the plurality of output terminals extends from a second side of the driver circuit that is opposite to the first side and is arranged along the longitudinal direction of the base body. The plurality of input terminals is electrically connected to the at least one row of input bumps and the plurality of output terminals is electrically connected to the at least three rows of first output bumps on a top face of the base body through the plurality of conductive wirings.

The driver chip according to at least one embodiment of the invention may further include an impact absorption layer disposed between the base body and the plurality of conductive wirings.

According to at least one embodiment of the invention, first output bumps arranged in each row are spaced apart from first output bumps in an adjacent row along a longitudinal direction of the base body. The plurality of first output bumps is symmetrically arranged about a center line of the base body.

The driver chip according to at least one embodiment of the invention may further include a plurality of second output bumps disposed at one side of the plurality of input bumps and the plurality of first output bumps and arranged in at least one row along a direction of the base body that is substantially perpendicular to the longitudinal direction of the base body, and a plurality of third output bumps disposed at another side of the plurality of input bumps and the plurality of first output bumps and arranged in at least one row along a direction of the base body that is substantially perpendicular to the longitudinal direction of the base body.

BRIEF DESCRIPTION OF THE DRAWINGS

The above and other features of the present invention will become more apparent by describing in detail exemplary embodiments thereof with reference to the attached drawings in which.

DESCRIPTION OF PREFERRED EMBODIMENTS

Hereinafter preferred embodiments of the invention will be described in detail with reference to the accompanying drawings.

Figure 1:
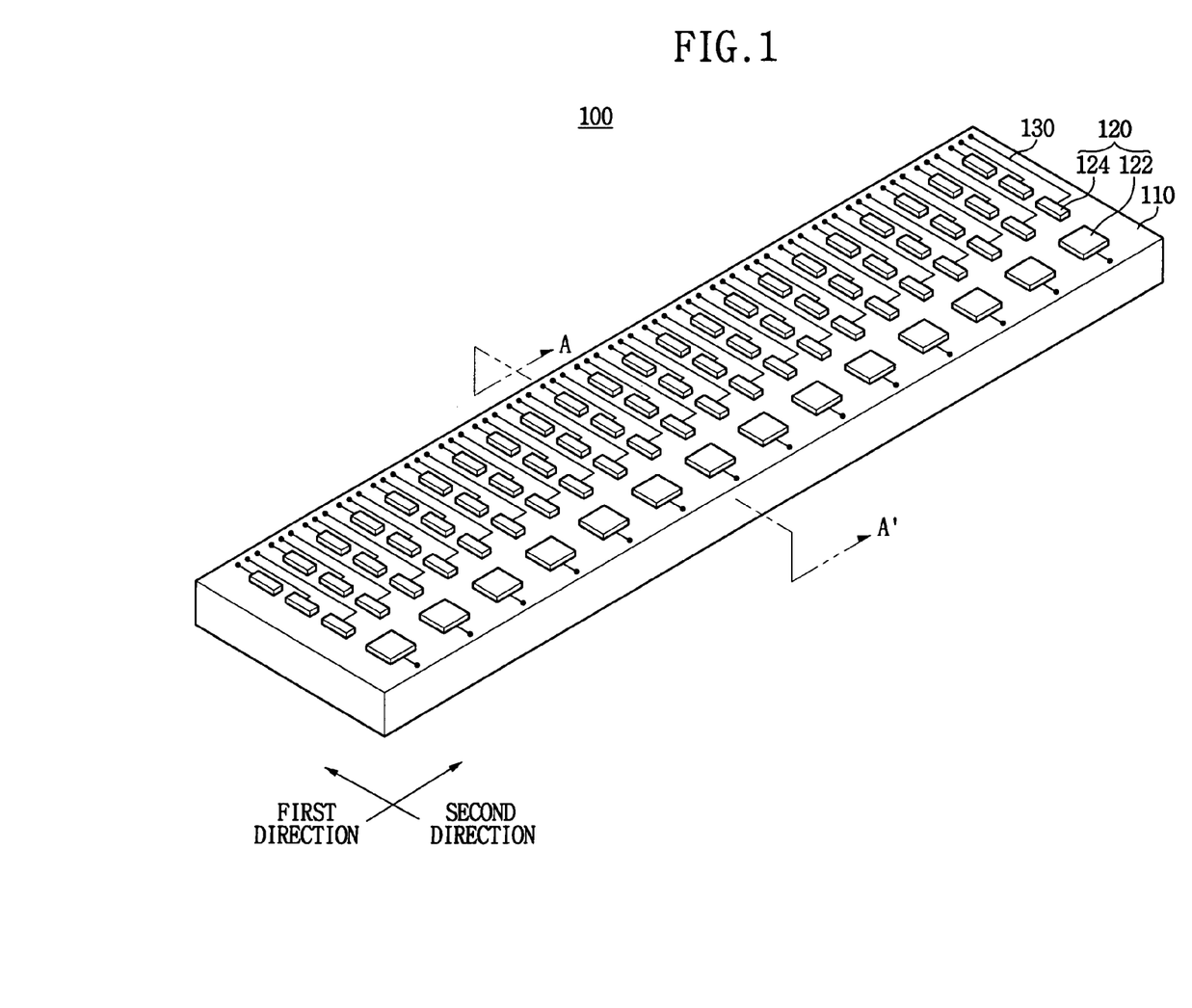
FIG. 1 is a perspective view of a driver chip according to an exemplary embodiment of the present invention.
Figure 2:
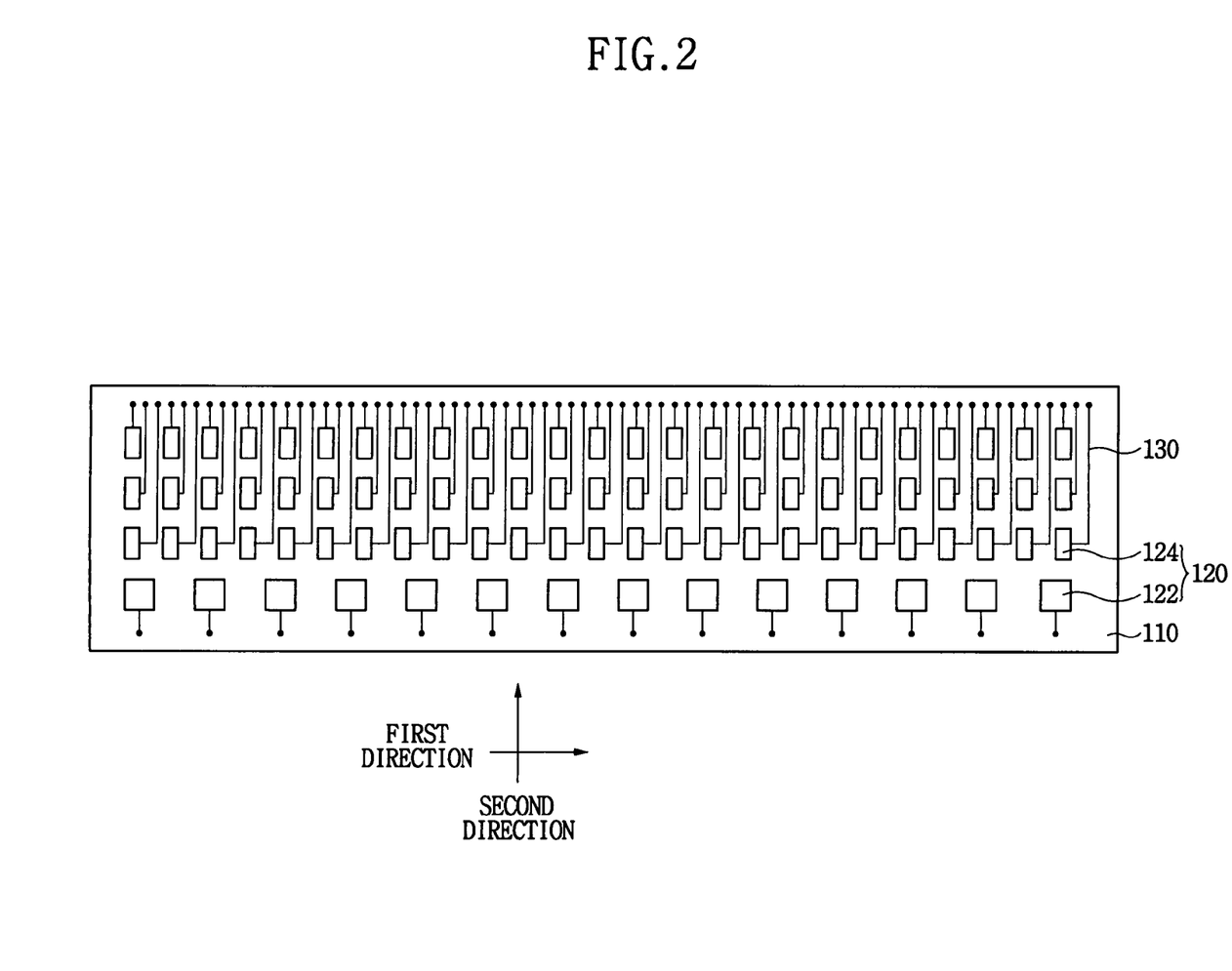
FIG. 2 is a top view of the driver chip of FIG. 1.

FIG. 1 is a perspective view of a driver chip according to an exemplary embodiment of the present invention. FIG. 2 is a top view of the driver chip of FIG. 1.

Referring to FIGS. 1 and 2, the driver chip 100 includes a base body 110, conductive bumps 120 and conductive wirings 130.

The base body 110 is made of a conductive material and has a rectangular parallelepiped shape. A driver circuit 112 (See FIG. 3) that converts an image signal from an external source into a drive signal is formed inside the base body 110. The driver circuit 112 is formed by a semiconductor manufacturing process.

At least four rows of the conductive bumps 120 are formed on the base body 110. Each row is aligned on the base body 110 along a first direction that is parallel to the longitudinal direction of the base body 110. Each of the conductive bumps 120 has a quadrangular cross-section taken along a plane parallel to a top face of the base body 110.

The conductive bumps 120 include input bumps 122 and output bumps 124. The input bumps 122 may be aligned in one row along the first direction. The output bumps 124 may be aligned in three rows along the first direction. Depending on the number of conductive bumps 120, the input bumps 122 may be aligned in at least one row, and the output bumps 124 may be aligned in at least three rows. The input bumps 122 and the output bumps 124 may have substantially identical shapes and sizes. When the number of desired input bumps 122 is relatively small, however, the input bumps 122 may have a larger size than that of the output bumps 124.

The conductive wirings 130 are formed on the top face of the base body 110 on which the conductive bumps 120 are formed. The conductive wirings 130 are connected to the driver circuit 112 in an edge region that is parallel to the first direction of the base body 110. Each of the conductive wirings 130 is extended from the edge region to a central region of the base body 110 to be connected to each of the conductive bumps 120. Thus, the driver circuit 112 in the base body 110 is electrically connected to the conductive bumps 120 by the conductive wirings 130.

By forming the conductive wirings 130 on the top face of the base body 110, the position of the conductive bumps 120 may be shifted to the central region of the top face of the base body 130. Moreover, the conductive bumps 120 may be formed in at least four rows.

Figure 3:
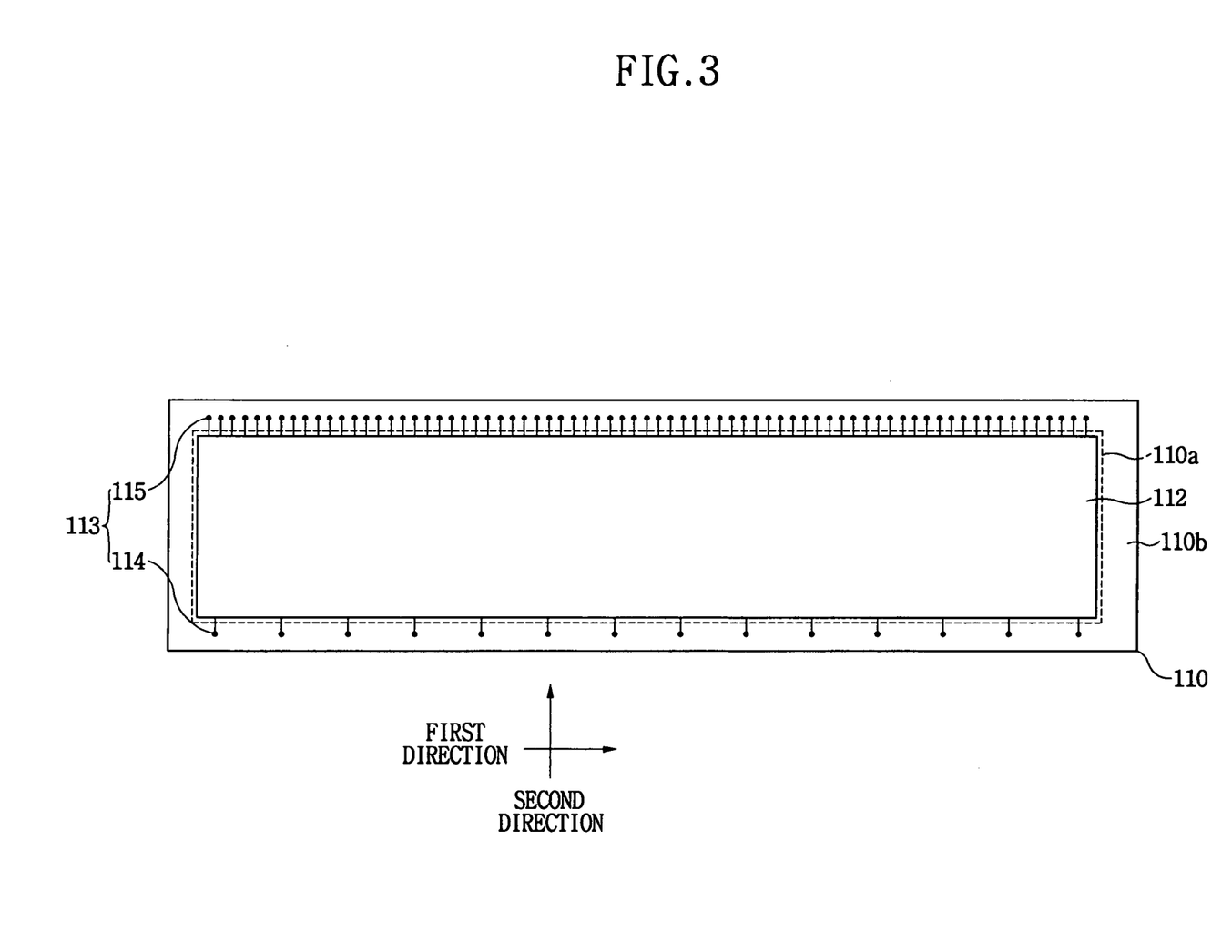
FIG. 3 is a cross-sectional view taken along a plane parallel to the top face of the base body in the driver chip of FIG. 1.
Figure 4:
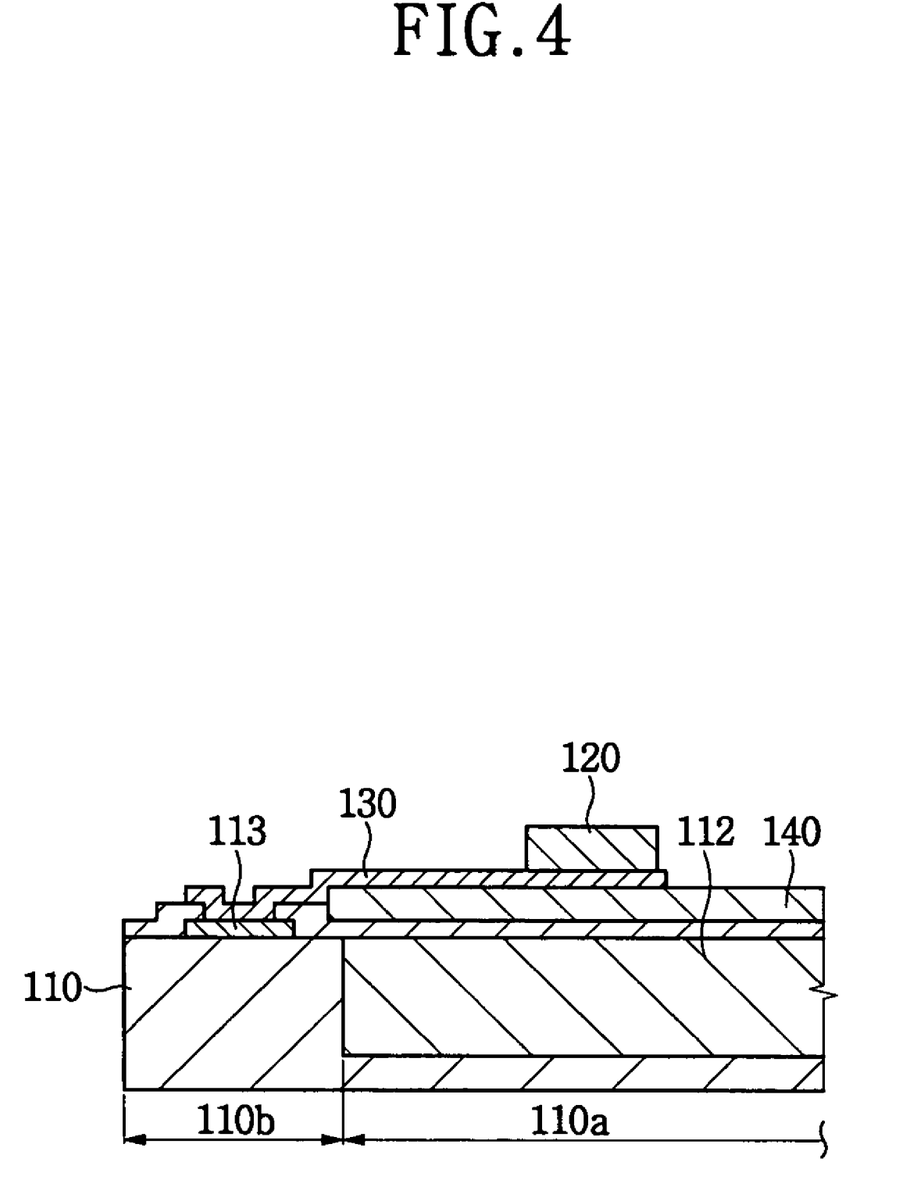
FIG. 4 is a cross-sectional view taken along a line A-A' of FIG. 1.

FIG. 3 is a cross-sectional view taken along a plane parallel to the top face of the base body in the driver chip of FIG. 1. FIG. 4 is a cross-sectional view taken along a line A-A' of FIG. 1.

Referring to FIGS. 3 and 4, the base body 110 has the driver circuit 112 formed by a semiconductor manufacturing process inside the base body 110. The driver circuit 112 converts the image signal from an external source into a drive signal to operate a display panel (not shown).

The base body 110 is divided into a cell region 110a and a peripheral region 110b. The peripheral region 110b adjacent to the cell region 110a surrounds the cell region 110a.

The base body 110 has conductive terminals 113 connected to the driver circuit 112. The conductive terminals 113 are extended from the driver circuit 112 to the peripheral region 110b. The conductive terminals 113 include input terminals 114 and output terminals 115. The input terminals 114 receive an image signal from an external source, and the output terminals 115 output the drive signal from the driver circuit 112. The input terminals 114 extend from a first side of the driver circuit 112 to be arranged along the longitudinal direction of the base body 110. The output terminals 115 extend from a second side of the driver circuit 112 opposite to the first side to be arranged along the longitudinal direction of the base body 110. Depending on the desired number of output terminals 115, the output terminals 115 may be aligned in at least two rows along the longitudinal direction of the base body 110. Alternatively, the output signals 115 may be arranged along the first side, a third side and a fourth side of the driver circuit 112 in at least one row. The third and fourth sides are substantially perpendicular to the first side of the driver circuit 112.

The input terminals 114 and the output terminals 115 are electrically connected to the input bumps 122 and the output bumps 124 respectively through the conductive wirings 130 formed on the top face of the base body 110.

Referring to FIG. 4, the conductive terminals 113 are formed in the peripheral region 110b of the base body 110. The conductive terminals 113 are also externally exposed outside of the base body 110. The conductive bumps 120 are formed in the cell region 110a of the base body 110. One end portion of the conductive wirings 130 is connected to a corresponding conductive terminal 113 in the peripheral region 110b. Another end portion of the conductive wirings 130 is extended to the cell region 110a to be connected to the conductive bumps 120. The conductive wirings 130 are made of a metallic material having a low resistance to connect the conductive terminals 113 to the conductive bumps 120 in a stable state.

As described above, by using the conductive wirings 130, the conductive bumps 120 can be formed in the cell region 110a instead of the peripheral region 110b having the conductive terminals 113 formed thereon. Hence, the size of the peripheral region 110b may be reduced, which in turn allows the size of the base body 110 to be reduced.

The driver chip 100 may further include an impact absorption layer 140 between the base body 110 and the conductive wirings 130. The impact absorption layer 140 reduces the external impact on the driver circuit 112 through the conductive bumps 120. The driver chip 100 is connected to the external displaying panel (now shown) by a heat compression process. During the compression process, an external impact may be transferred to the conductive bumps 120 which are directly connected to the display panel. Since the conductive bumps 120 are arranged in the cell region 110a corresponding to the driver circuit 112, the external impact transferred to the conductive bumps 120 may be conveyed to the driver circuit, thereby causing failures of the driver circuit 112. Thus, the impact absorption layer 140 formed between the conductive bump 120 and the driver circuit 112 may reduce the external impact on the driver circuit 112. The impact absorption layer 140 preferably includes insulating material to insulate the conductive wirings 130 from one another.

Figure 5:
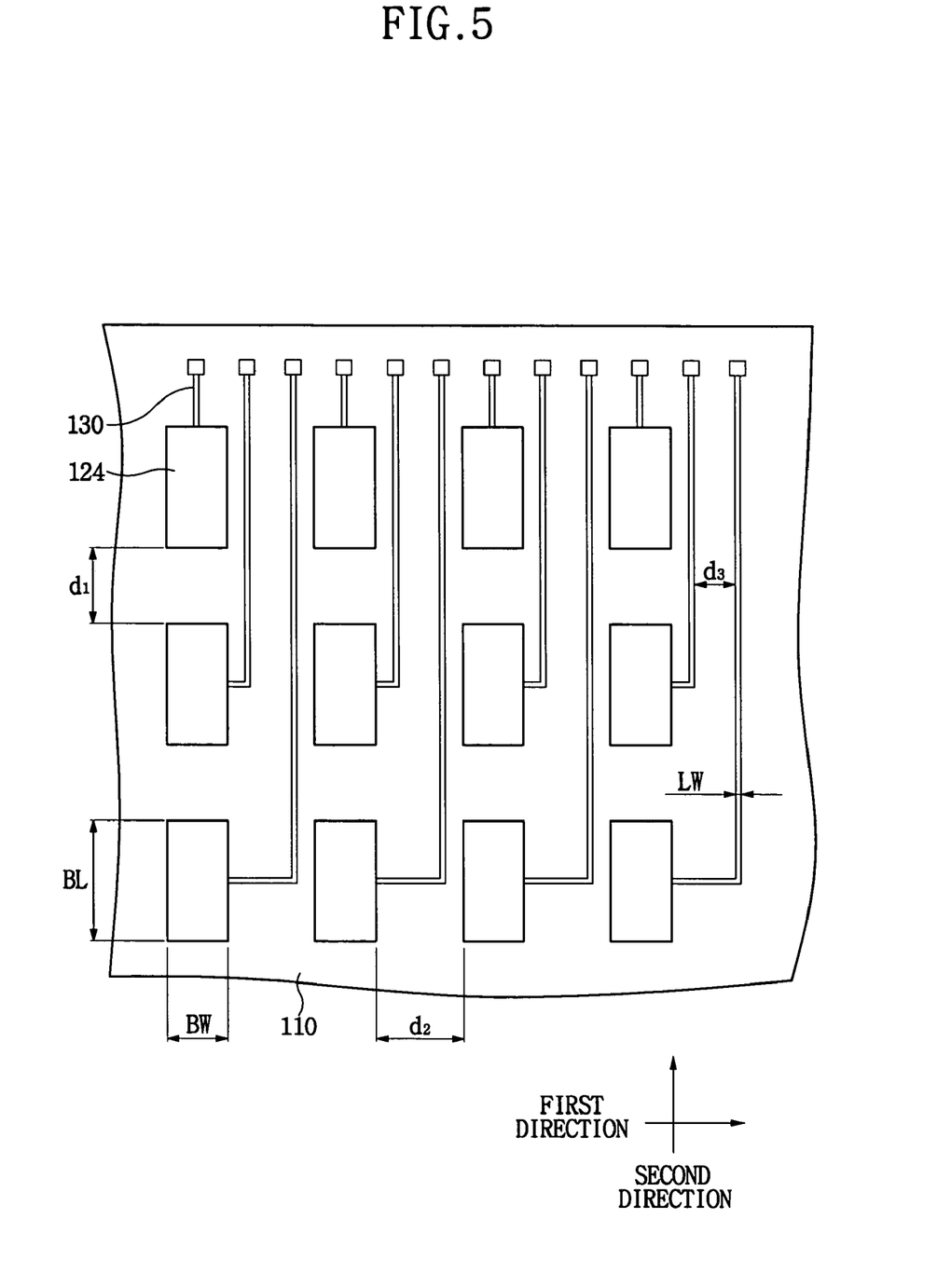
FIG. 5 is an enlarged top view illustrating the connection between the output bumps and the conductive wirings of FIG. 2.

FIG. 5 is an enlarged top view illustrating the connection between the output bumps and the conductive wirings of FIG. 2.

Referring to FIG. 5, the output bumps 124 have a quadrangular shape with substantially identical bump widths (BW) and bump lengths (BL). The output bumps 124 are arranged on the top face of the base body 110 in three rows. Each row of the output bumps 124 is arranged along the first direction that is parallel to the longitudinal direction of the base body 110. The three rows are spaced apart from each other by a first distance d1. The output bumps 124 arranged in each row are spaced apart from each other by a second distance d2. The output bumps 124 are oriented in each row along the second direction that is substantially perpendicular to the first direction of the base body 110.

The conductive wirings 130 extend from the edge region of the base body 110 to be connected to a corresponding output bump 124. Each conductive wiring 130 has a wiring width LW. The conductive wirings 130 are spaced apart from each other by a third distance d3.

By arranging the output bumps 124 in three rows, the area of the output bumps 124 that are in contact with an external display panel may be increased.

For example, the driver chip 100 used for a display panel having a resolution of about 240×320 includes about one thousand and forty output bumps 124 and has a size of 20 mm (width)×3 mm (length). Generally, the arrangement of about one thousand and forty output bumps 125 determines the area of the output bumps 124.

TABLE 1

| | Wiring width (μm) | Interval between wirings (μm) | Interval between wiring and bump(μm) | Interval between bumps (μm) | Pitch (μm) | Bump width (μm) |
|---|---|---|---|---|---|---|
| Two rows | 10 | — | 5 | 20 | 40 | 20 |
| Three rows | 10 | 5 | 5 | 35 | 60 | 25 |
| Four rows | 10 | 5 | 5 | 50 | 80 | 30 |
| Five rows | 10 | 5 | 5 | 65 | 100 | 35 |
| Six rows | 10 | 5 | 5 | 80 | 120 | 40 |

The bump width (BL) according to the number of rows of the output bumps 124 is shown in Table 1. In Table 1, the wiring width, the interval between the wirings and the interval between the wiring and the bump depend on the design rule of the display panel. In this case, the wiring width (LW) of the conductive wirings 130 is about 10 μm, and the third distance d3 between the conductive wirings 130 is about 5 μm. The interval between the conductive wirings 130 and the output bumps 124 is about 5 μm. The distance d2 between the output bumps 124 is determined by the wiring width LW, the interval d3 between the wirings and the interval between the wirings and the bumps. The pitch represents the distance between the center of an output bump 124 and the center of an adjacent output bump 124. The pitch is determined by the top face area of the base body 110 and the number of output bumps 124. The bump width BW corresponds to the pitch minus the interval between the output bumps 124.

As shown in Table 1, the bump width (BW) of the output bumps 124 increases as the number of rows increase. Thus, in the case in which the bump length (BL) of the output bumps 124 is constant, the size of the output bumps 124 increases as the number of rows increase. Thus, the bump area that corresponds to a total area of all output bumps 124 also increases.

Figure 6:
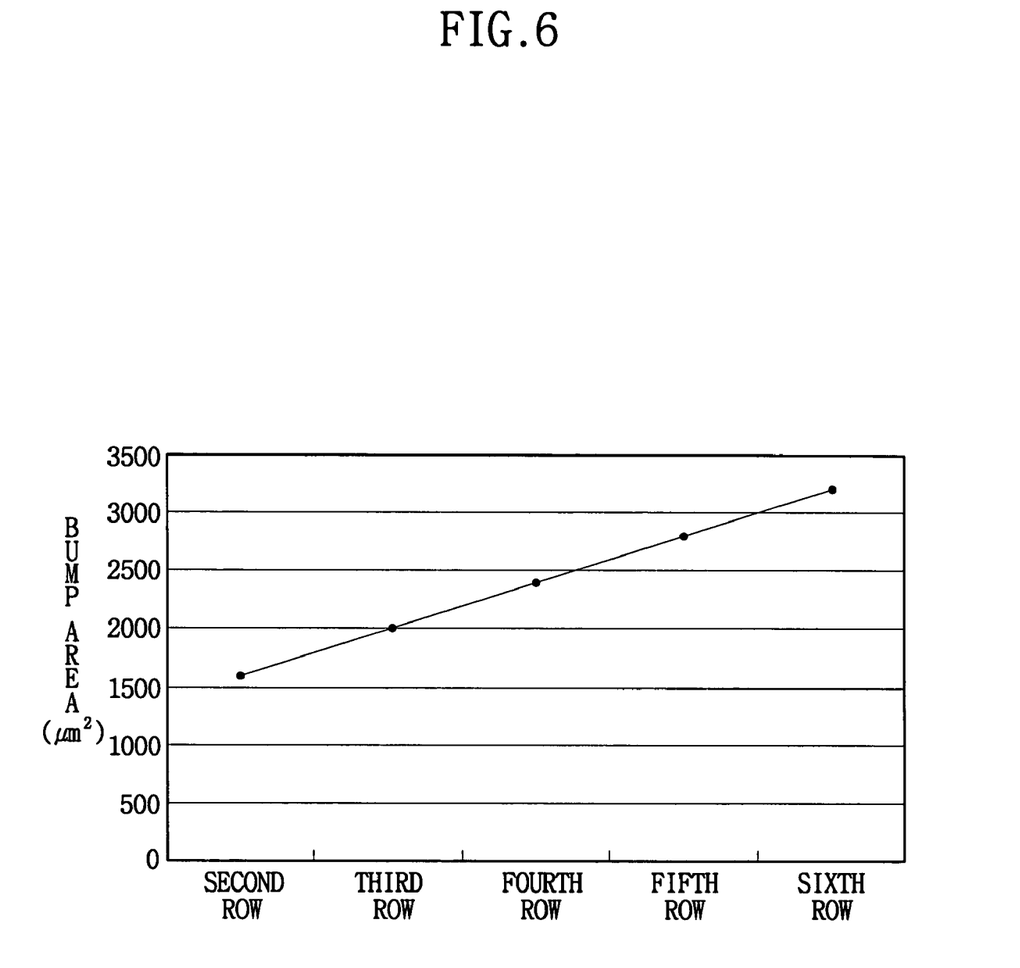
FIG. 6 is a graph of bump area versus number of rows of output bumps.

FIG. 6 is a graph of bump area versus number of rows of output bumps. In FIG. 6, the bump length (BL) of the output bump 124 is about 80 μm.

Referring to FIG. 6, the bump area increases as the number of rows increases. In particular, when the output bumps 124 are arranged in two rows, the bump area corresponding to-the product of bump width, bump length and the number of the output bumps 124 is about 1664 μm$^2$. When the output bumps 124 are arranged in three rows, the bump area is about 2,080 μm$^2$.

The bump area is preferably over about 2,000 μm$^2$ to connect the driver chip 100 to the display panel in a stable state. Thus, as shown in FIG. 6, the reliability of connection between the driver chip and the display panel may be improved by arranging the output bumps 124 in at least three rows.

Figure 7:
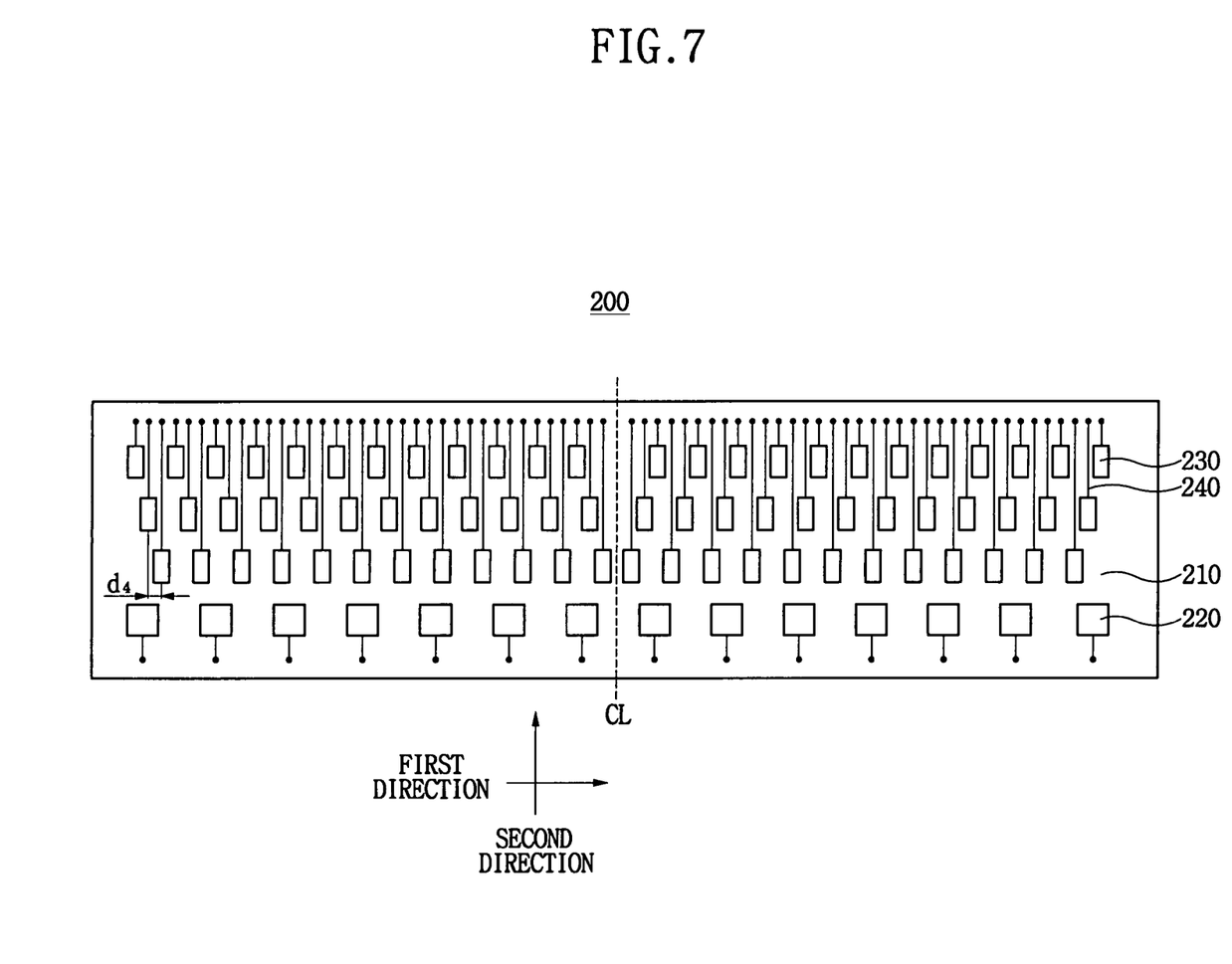
FIG. 7 is a top view of a driver chip according to another embodiment of the present invention.

FIG. 7 is a top view illustrating a driver chip according to another embodiment of the present invention.

Referring to FIG. 7, the driver chip 200 includes a base body 210, input bumps 220, output bumps 230 and conductive wirings 240.

The input bumps 220 are arranged in one row along a first direction of the base body 210 corresponding to the longitudinal direction of the base body 210.

The output bumps 230 are arranged in three rows along the first direction. The output bumps 230 arranged in each row are spaced apart from those in an adjacent row by a fourth distance d4 in the first direction. The fourth distance d4 is determined considering the wiring width of the conductive wirings 240, the distance between the output bumps 230 and the conductive wirings 240, etc.

The output bumps 230 are symmetrically arranged about a cyber central line CL that divides the length of the base body 120 into substantially identical two parts. An anisotropic conductive film (ACF) is used to connect the driver chip 200 to an external display panel. The adhesive resin included in the ACF flows between the output bumps 230, when the driver chip 200 is combined with the display panel. By symmetrically forming the output bumps 230, the adhesive resin may be uniformly spread on the driver chip 200.

Each of the conductive wirings 240 extends from the edge region of the base body 210 in a straight line to be connected to a corresponding output bump 230. It should be appreciated that in other exemplary embodiments of the invention, the conductive wirings 240 may not extend in a straight line.

When the conductive wirings 240 extend from the edge region of the base body 210 to the output bumps 230, the distance between the output bumps 230 and the conductive wirings 240 may be increased in the position corresponding to the output bump 230 in another row. Increase of the distance between the output bump 230 and the conductive wiring 240 may reduce a signal distortion that may be generated between the adjacent output bump 230 and the conductive wiring 240.

In the present embodiment of the invention, the output bumps 230 are arranged in three rows. Alternatively, the output bumps 230 may be arranged in at least four rows depending on the number of output bumps 230.

Figure 8:
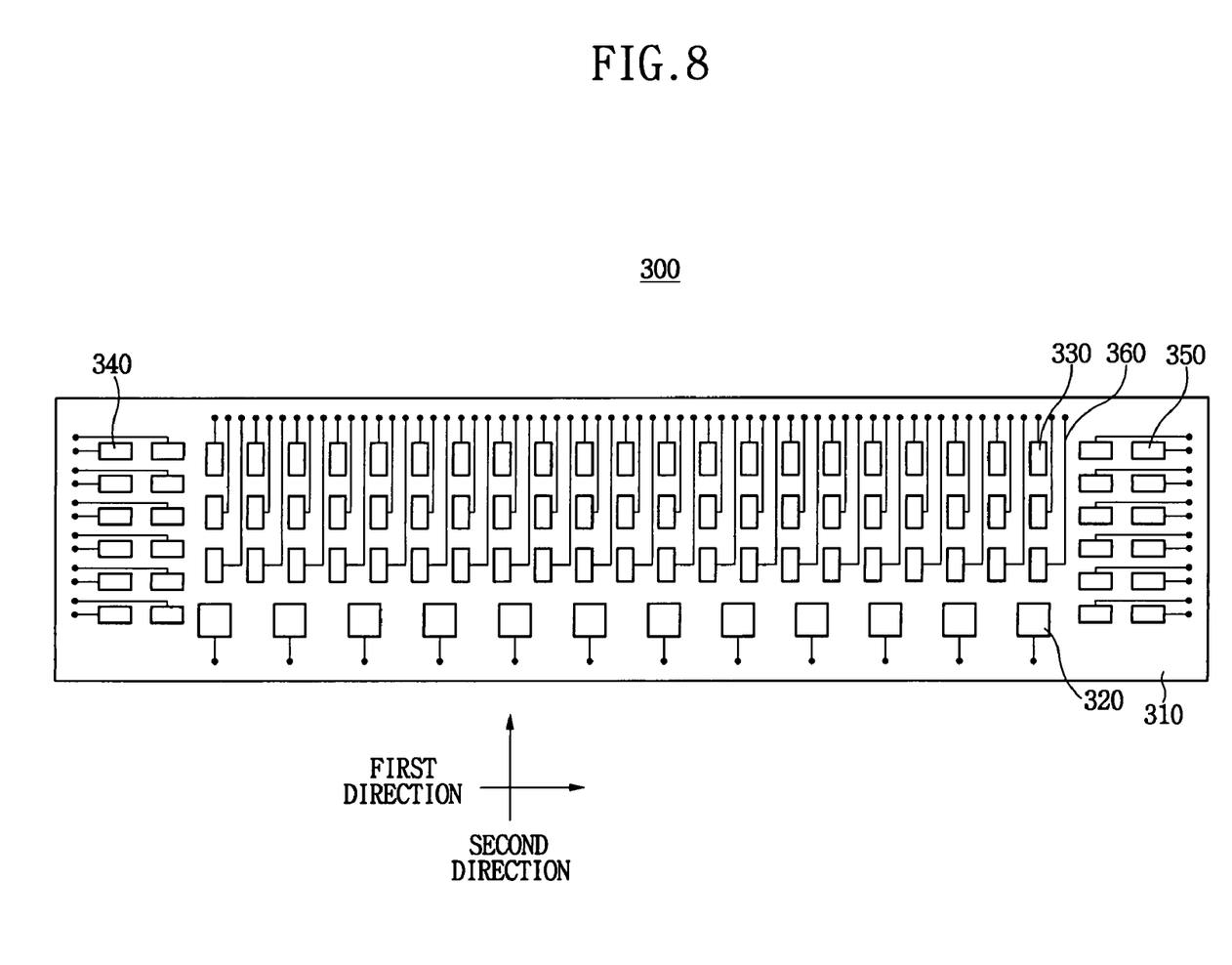
FIG. 8 is a top view of a driver chip according to another embodiment of the present invention.

FIG. 8 is a top view illustrating a driver chip according to another embodiment of the present invention.

Referring to FIG. 8, the driver chip 300 includes a base body 310, input bumps 320, first output bumps 330, second output bumps 340, third output bumps 350 and conductive wirings 360. In present embodiment of the invention, the structures of the input bumps 320 and the first output bumps 330 are substantially identical to those in the embodiment of the invention shown in FIG. 2, and therefore are not described here in further detail.

The second and third output bumps 340 and 350 are formed on both sides of the input bumps 320 and the first output bumps 330, respectively. The second and third output bumps 340 and 350 are arranged in at least one row along a second direction of the base body 310 that is substantially perpendicular to the longitudinal direction of the base body 310. Although the second and third output bumps 340 and 350 are arranged in two tows in FIG. 8, the second and third output bumps 340 and 350 are preferably arranged in a number of rows identical to that of the first output bumps 330.

When a display panel combined with the driver chip 300 is, for example, a liquid crystal display panel, the first output bumps 330 are connected to the data line formed on the liquid crystal display panel. The second and third output bumps 340 and 350 are connected to the gate line that is perpendicular to the data line on the liquid crystal display panel.

Various exemplary embodiments of the driver chips according to the present invention have been described. Hereinafter, a display apparatus having the driver chips will be described.

Figure 9:
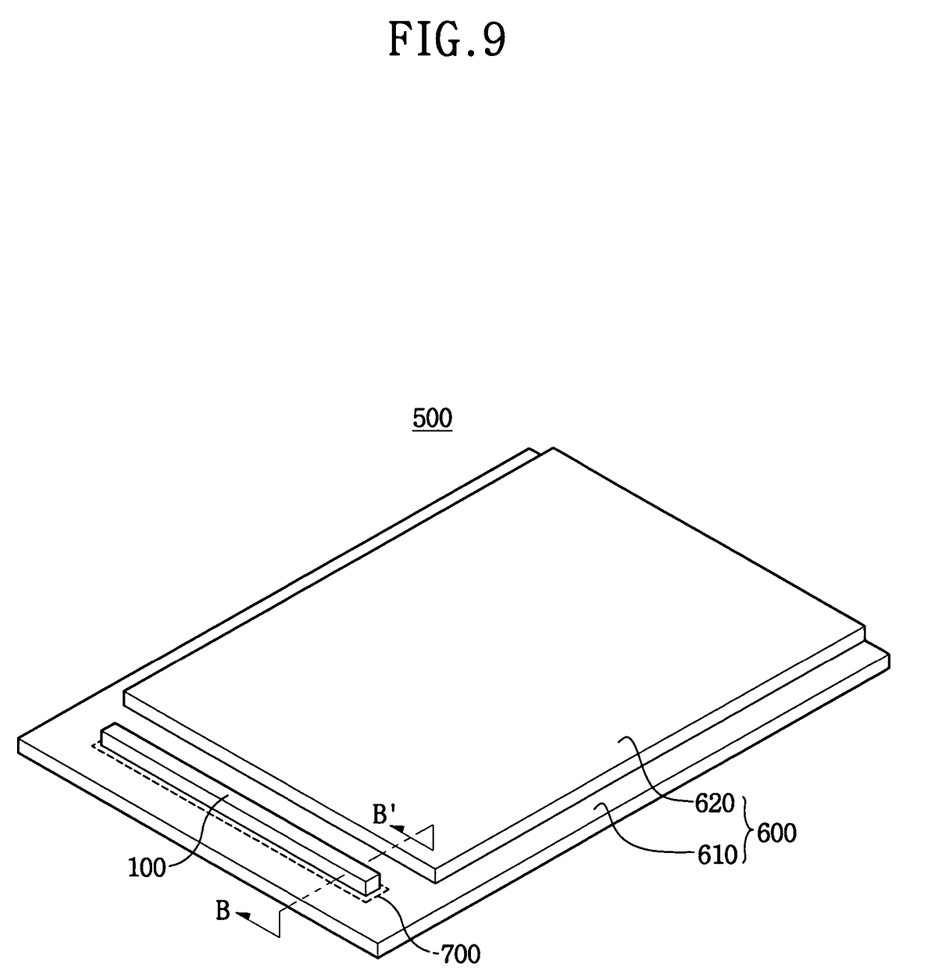
FIG. 9 is a perspective view of a display apparatus according to an exemplary embodiment of the present invention.
Figure 10:
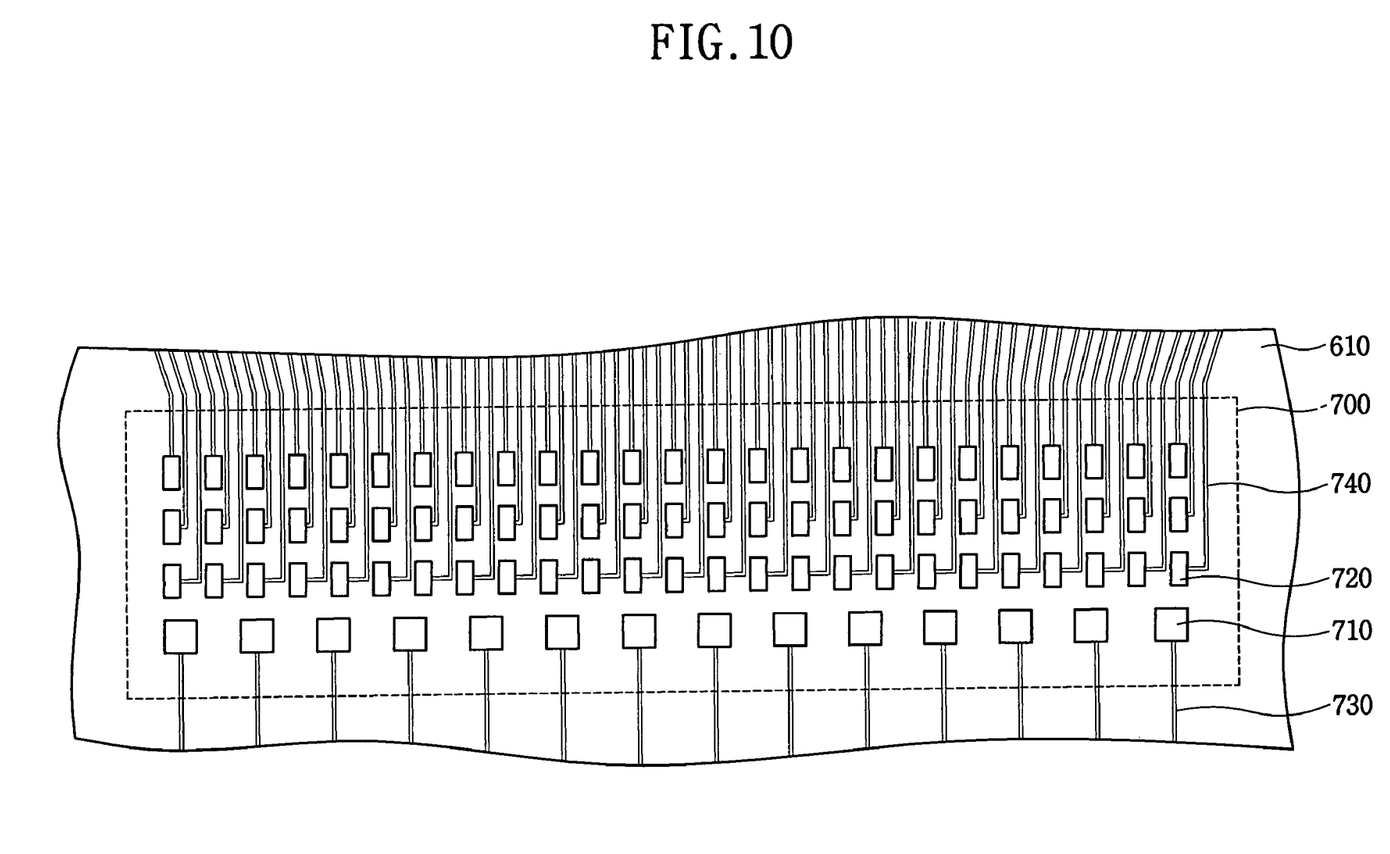
FIG. 10 is a partially enlarged top view of the pad portion of the first substrate in FIG. 9.

FIG. 9 is a perspective view illustrating a display apparatus according to an exemplary embodiment of the present invention. FIG. 10 is a partially enlarged top view illustrating the pad portion of the first substrate in FIG. 9. A driver chip in the present embodiment of the invention has a structure substantially identical to that of the driver chip 100 in FIGS. 1 and 2. Thus, identical reference numerals will be used for identical elements and descriptions thereof will be omitted.

Referring to FIGS. 9 and 10, the display apparatus 500 includes a driver chip 100 and a display panel 600.

Examples of the display panel 600 include a liquid crystal display panel. The display panel 600 includes a first substrate 610, a second substrate 620 corresponding to the first substrate, and a liquid crystal layer 615 interposed between the first substrate 610 and the second substrate 620.

The first substrate 610 is made of transparent glass. Thin film transistors are formed on the first substrate 610 in a shape of a matrix as a switching device. The source terminals of the thin film transistors are connected to data lines, and the gate terminals of the thin film transistors are connected to gate lines. A drain electrode is connected to a pixel electrode composed of a transparent conductive material.

The first substrate 610 includes a pad portion 700 connected to the driver chip 100 and a plurality of signal lines 730 and 740 connected to the pad portion 700.

The pad portion 700 has input pads 710 and output pads 720.

The input pads 710 are formed on the first substrate 610 in one row. Each of the input pads 710 is connected to a corresponding input signal line 730 among the plurality of signal lines 730 and 740. The input signal lines 730 are connected to a signal applying member (not shown) that is connected to the first substrate 610 for externally applying an image signal to the first substrate 610. The input pads 710 correspond to the input bumps 122 to apply the image signal from the signal applying member and the input signal lines 730 to the driver chip 100.

The output pads 720 are formed in three rows apart from the input pad 710 by a predetermined distance. The output pads 720 correspond to the output pads 124 on the driver chip 100. Each of the output pads 720 is connected to a corresponding output signal line 740 among the plurality of signal lines 730 and 740. The output signal lines 740 apply an image signal outputted from the driver chip 100 to the first substrate 610. The output signal lines 740 are connected to the data lines and the gate lines crossing the data lines in an insulation condition. The data lines 613 extend in a first direction on the first substrate 610 and the gate lines 614 extend in a second direction substantially perpendicular to the first direction on the first substrate 610.

The pad portion 700 may be modified depending upon the arrangement of the bumps of the driver chip 100. Since the input pads 710 and the output pads 720 of the pad portion 700 correspond to the input bumps 122 and the output bumps 124 of the driver chip 100, respectively, the arrangements of the input pads 710 and the output pads 720 vary according to the arrangements of the input bumps 122 and the output bumps 124.

The second substrate 620 has red, green and blue pixels formed thereon by a thin film manufacturing process. A common electrode 622 composed of a transparent conductive material is formed on the second substrate 620.

In the display panel 600, power is supplied to the gate terminal and the source terminal of the thin film transistor 612 to turn on the thin film transistor 612. An electric field is formed between the pixel electrode and the common electrode 622. The electric field changes the arrangement of the liquid crystal between the first substrate 610 and the second substrate 620. The arrangement change of the liquid crystal changes the light transmittance to display an image.

The driver chip 100 is connected to the pad portion 700 of the first substrate 610.

Figure 11:
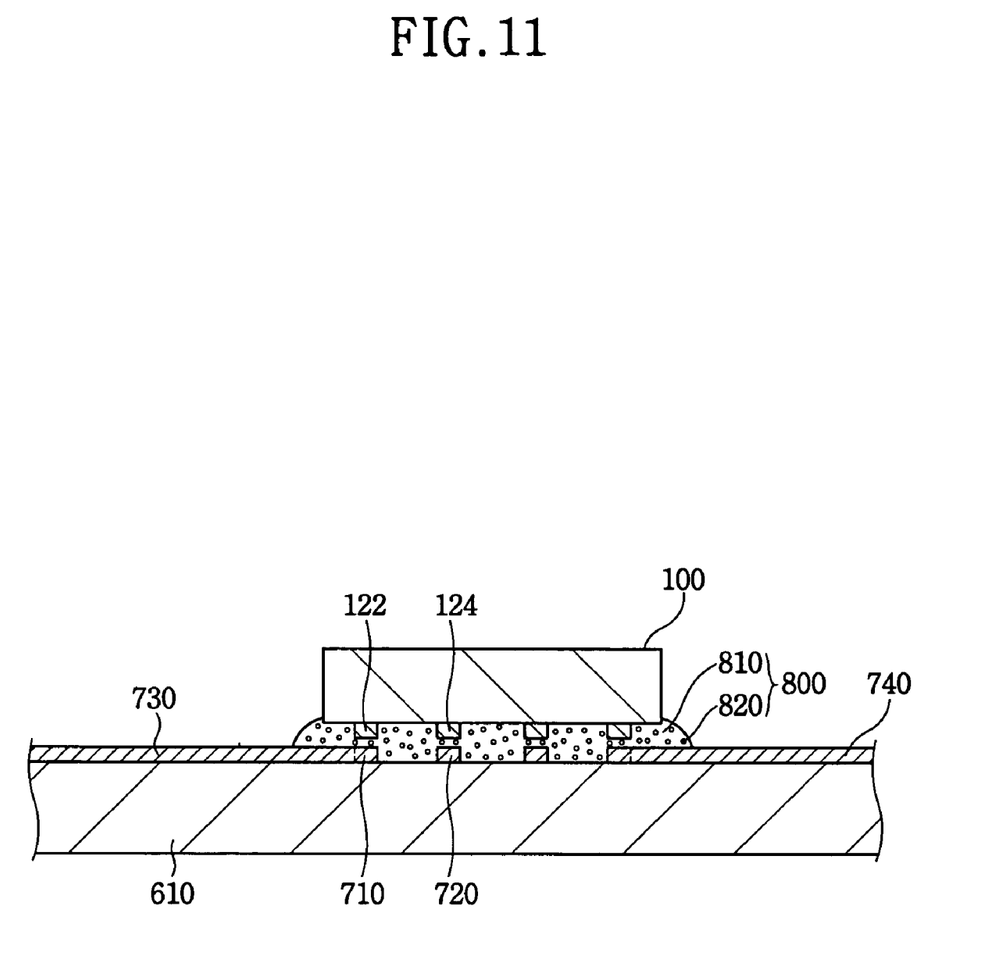
FIG. 11 is a cross-sectional view taken along the line B-B' of FIG. 9.

FIG. 11 is a cross-sectional view taken along the line B-B' of FIG. 9.

Referring to FIG. 11, the driver chip 100 is mounted on the pad portion 700 of the first substrate 610 by a COG process. The driver chip 100 is combined with the first substrate 610 after an anisotropic conductive film 800 is interposed between the driver chip 100 and the first substrate 610.

The anisotropic conductive film 800 includes an adhesive resin 810 and a plurality of conductive particles 820 randomly dispersed in the adhesive resin 810.

The conductive particles 820 have a spherical shape. The conductive particles 820 are disposed between the input bumps 122 and the input pads 710 as well as between the output bumps 124 and the output pads 720. An externally provided pressure deforms the conductive particles 820 and connects the input bump 122 to the input pad 710 as well as the output bump 124 to the output pad 720 via the adhesive resin 810.

The adhesive resin 810 is preferably composed of a thermosetting resin. The adhesive resin is cured by externally provided heat to fix the driver chip 100 on the first substrate 610.

In the present embodiment of the invention, a liquid crystal display panel has been described as an example of the display panel 600. It should be appreciated by those having ordinary skill in the art that various display panels such as plasma display panels and organic electroluminescence display panels may also be used as the display panel.

In a display panel including the driver chip according to various exemplary embodiments of the present invention, the conductive bumps connected to the display panel are shifted to the central portion of the driver chip by the conductive wirings. The conductive bumps may be arranged in at least four rows.

Arranging the conductive bumps in at least four rows tends to increase the distance between conductive bumps and the size of each conductive bump. Accordingly, the reliability of the connection between the display panel and the driver chip may be improved.

Although the exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A driver chip comprising:
   a base body comprising a driver circuit formed therein, a top face of the base body including a cell region corresponding to the driver circuit and a peripheral region surrounding the cell region;
   a plurality of conductive terminals disposed in the peripheral region and electrically connected to the driver circuit;
   a plurality of conductive bumps disposed over the cell region of the top face of the base body, the plurality of conductive bumps comprising a plurality of first output bumps outputting driving signals generated by the driver circuit to an external device and the plurality of first output bumps being arranged in a plurality of rows along the longitudinal direction of the base body; and
   a plurality of conductive wirings extending over the top face of the base body and electrically connecting the plurality of conductive terminals to the plurality of conductive bumps, each of the conductive wirings including a first end disposed on a corresponding one of the plurality of conductive terminals and a second end, which is opposite to the first end, disposed under a corresponding one of the plurality of conductive bumps.

2. The driver chip of claim 1, wherein the plurality of first output bumps are arranged in at least three rows.

3. The driver chip of claim 2, wherein the plurality of conductive bumps further comprise:
   a plurality of input bumps arranged in at least one row.

4. The driver chip of claim 1, wherein the plurality of conductive terminals comprises:
   a plurality of input terminals that receive a signal from an external source; and
   a plurality of output terminals that output a signal from the driver circuit.

5. The driver chip of claim 4, wherein the plurality of input terminals extends from a first side of the driver circuit and is arranged along the longitudinal direction of the base body, and the plurality of output terminals extends from a second side of the driver circuit that is opposite to the first side and is arranged along the longitudinal direction of the base body.

6. The driver chip of claim 4, wherein the plurality of input terminals is electrically connected to the at least one row of input bumps and the plurality of output terminals is electrically connected to the at least three rows of first output bumps on a top face of the base body through the plurality of conductive wirings.

7. The driver chip of claim 6, further comprising:
   an impact absorption layer disposed between the base body and the plurality of conductive wirings.

8. The driver chip of claim 3, wherein first output bumps arranged in each row are offset from first output bumps in an adjacent row along a longitudinal direction of the base body.

9. The driver chip of claim 8, wherein the plurality of first output bumps is symmetrically arranged about a center line of the base body.

10. The driver chip of claim 3, further comprising:
    a plurality of second output bumps disposed at one side of the plurality of input bumps and the plurality of first output bumps and arranged in at least one row along a direction of the base body that is substantially perpendicular to the longitudinal direction of the base body; and
    a plurality of third output bumps disposed at another side of the plurality of input bumps and the plurality of first output bumps and arranged in at least one row along a direction of the base body that is substantially perpendicular to the longitudinal direction of the base body.

11. A display apparatus comprising the driver chip of claim 1.

12. A display apparatus comprising:
    a driver chip comprising:
       a base body comprising a driver circuit formed therein, a top face of the based body including a cell region corresponding to the driver circuit and a peripheral region surrounding the cell region;
       a plurality of conductive terminals disposed in the peripheral region and electrically connected to the driver circuit;
       a plurality of conductive bumps disposed over the cell region of the top face of the base body, the plurality of conductive bumps comprising a plurality of first output bumps being arranged in at least two rows, each row including at least three bumps, along the longitudinal direction of the base body; and
       a plurality of conductive wirings extending over the top face of the base body and electrically connecting the plurality of conductive terminals to the plurality of conductive bumps, each of the conductive wirings including a first end disposed on a corresponding one of the plurality of conductive terminals and a second end, which is opposite to the first end, disposed under a corresponding one of the plurality of conductive bumps; and
    a display panel comprising:
       a first substrate comprising a pad portion connected to the driver chip and a plurality of signal lines connected to the pad portion,
    wherein the plurality of first output bumps output driving signals generated by the driver circuit to the display panel.

13. The display apparatus of claim 12, wherein the plurality of first output bumps are arranged at least three rows.

14. The display apparatus of claim 13, wherein the plurality of conductive bumps further comprise:
    a plurality of input bumps arranged in at least one row.

15. The display apparatus of claim 14, wherein the pad portion further comprises:
    a plurality of input pads disposed in the pad portion arranged to correspond to the plurality of input bumps; and
    a plurality of output pads disposed in the pad portion arranged to correspond to the plurality of output bumps.

16. The display apparatus of claim 15, wherein the plurality of signal lines comprises a plurality of input signal lines and a plurality of output signal lines, the plurality of input signal lines applying an image signal to the plurality of input pads of the first substrate and the plurality of output signal lines applying a drive signal from the plurality of output pads to a plurality of data lines and a plurality of gate lines formed on the first substrate.

17. The display apparatus of claim 16, wherein the display panel further comprises:
   a second substrate disposed over the first substrate;
   a common electrode formed over the second substrate facing the plurality of data lines and the plurality gate lines of the first substrate; and
   a liquid crystal layer disposed between the first substrate and the second substrate.

18. The display apparatus of claim 14, wherein the plurality of conductive terminals comprises:
   a plurality of input terminals that receives a signal from an external source; and
   a plurality of output terminals that outputs a signal from the driver circuit.

19. The display apparatus of claim 18, wherein the plurality of input terminals extends from a first side of the driver circuit and is arranged along the longitudinal direction of the base body, and the plurality of output terminals extends from a second side of the driver circuit that is opposite to the first side and is arranged along the longitudinal direction of the base body.

20. The display apparatus of claim 18, wherein the plurality of input terminals is electrically connected to the at least one row of input bumps and the plurality of output terminals is electrically connected to the at least three rows of the first output bumps on a top face of the base body through the plurality of conductive wirings.

21. The display apparatus of claim 20, further comprising:
   an impact absorption layer disposed between the base body and the plurality of conductive wirings.

22. The display apparatus of claim 14, wherein the first output bumps arranged in each row are offset from first output bumps in an adjacent row along a longitudinal direction of the base body.

23. The display apparatus of claim 22, wherein the plurality of first output bumps is symmetrically arranged about a center line of the base body.

24. The display apparatus of claim 14, further comprising:
   a plurality of second output bumps disposed at one side of the plurality of input bumps and the plurality of first output bumps and arranged in at least one row along a direction of the base body that is substantially perpendicular to the longitudinal direction of the base body; and
   a plurality of third output bumps disposed at another side of the plurality of input bumps and the plurality of first output bumps and arranged in at least one row along a direction of the base body that is substantially perpendicular to the longitudinal direction of the base body.

* * * * *